(12) United States Patent
Wan et al.

(10) Patent No.: US 12,002,864 B2
(45) Date of Patent: Jun. 4, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Wei Wan, Hefei (CN); Pan Wang, Hefei (CN); Xuesheng Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 412 days.

(21) Appl. No.: 17/449,637

(22) Filed: Sep. 30, 2021

(65) Prior Publication Data
US 2022/0216312 A1   Jul. 7, 2022

Related U.S. Application Data

(63) Continuation of application No. PCT/CN2021/105595, filed on Jul. 9, 2021.

(30) Foreign Application Priority Data

Jan. 4, 2021   (CN) .......................... 202110004446.1

(51) Int. Cl.
*H01L 29/423*   (2006.01)
*H01L 29/40*    (2006.01)
*H10B 12/00*    (2023.01)

(52) U.S. Cl.
CPC ........ *H01L 29/4236* (2013.01); *H01L 29/401* (2013.01); *H01L 29/42364* (2013.01); *H01L 29/42376* (2013.01); *H01L 29/4238* (2013.01); *H10B 12/053* (2023.02); *H10B 12/34* (2023.02)

(58) Field of Classification Search
None
See application file for complete search history.

(56) References Cited

U.S. PATENT DOCUMENTS

| | | | |
|---|---|---|---|
| 4,893,160 A | 1/1990 | Blanchard | |
| 2007/0018215 A1 | 1/2007 | Sandhu | |
| 2007/0235783 A9 | 10/2007 | Sandhu | |
| 2013/0224919 A1 | 8/2013 | Ding | |
| 2016/0064480 A1 | 3/2016 | Sandhu et al. | |
| 2019/0164824 A1* | 5/2019 | Wang | H01L 21/32134 |

FOREIGN PATENT DOCUMENTS

| | | |
|---|---|---|
| CN | 101253617 A | 8/2008 |
| CN | 103295908 A | 9/2013 |
| CN | 110911476 A | 3/2020 |
| CN | 110970494 A | 4/2020 |
| CN | 112864155 A | 5/2021 |
| JP | 2018014497 A | 1/2018 |

* cited by examiner

*Primary Examiner* — Hsien Ming Lee
(74) *Attorney, Agent, or Firm* — Syncoda LLC; Feng Ma (57) ABSTRACT

A method for manufacturing the semiconductor structure includes: providing a substrate, in which active regions and isolation regions are formed; forming grooves in the active regions, which include first grooves located at upper portions and second grooves located at lower portions and communicating with the first grooves, and a width of the first grooves is greater than a width of the second grooves; and forming gate structures in the first grooves and the second grooves.

19 Claims, 11 Drawing Sheets

FIG. 1

| Providing a substrate, in which active regions and isolation regions for isolating the active regions are formed | — S100 |

| Forming grooves in the active regions, which include first grooves located at upper portions and second grooves located at lower portions and communicating with the first grooves, and a width of the first grooves is greater than a width of the second grooves | — S200 |

| Forming gate structures in the first grooves and the second grooves | — S300 |

METHOD FOR MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/105595 filed on Jul. 9, 2021, which claims priority to Chinese Patent Application No. 202110004446.1 filed on Jan. 4, 2021. The disclosures of these applications are hereby incorporated by reference in their entirety.

BACKGROUND

A Dynamic Random-Access Memory (DRAM) is a semiconductor memory capable of writing and reading data randomly at a high speed, and is widely used in data storage devices or apparatuses.

SUMMARY

This disclosure relates to the technical field of memories, and particularly relates to a method for manufacturing a semiconductor structure and the semiconductor structure.

A first aspect of the embodiments of this disclosure provides a method for manufacturing a semiconductor structure, including the following operations.

A substrate is provided, in which active regions and isolation regions for isolating the active regions are formed.

Grooves are formed in the active regions, in which the grooves include first grooves located at upper portions and second grooves located at lower portions and communicating with the first grooves, and a width of the first grooves is greater than a width of the second grooves.

Gate structures are formed in the first grooves and the second grooves.

A second aspect of the embodiments of this disclosure provides a semiconductor structure, including a substrate, grooves and gate structures.

In the substrate, active regions and isolation regions for isolating the active regions are arranged.

The grooves are arranged in the active regions. The grooves include first grooves located at upper portions and second grooves located at lower portions and communicating with the first grooves, and a width of the first grooves is greater than a width of the second grooves, such that step surfaces are formed between the first grooves and the second grooves.

Gate structures are arranged in the first grooves and the second grooves. Top surfaces of the gate structures are lower than top surfaces of the first grooves.

DETAILED DESCRIPTION

A DRAM is composed of a plurality of repeated storage units. Each of the storage units usually includes a capacitor structure and a transistor. A gate electrode of the transistor is connected with a word line, a drain electrode of the transistor is connected with a bit line, and a source electrode of the transistor is connected with the capacitor structure. Voltage signals on the word line can control the on or off of the transistor, such that data information stored in the capacitor structure can be read through the bit line, or data information can be written into the capacitor structure through the bit line for storage.

As the integration level of the DRAM becomes higher and higher, the structure size of the transistor becomes smaller and smaller, such that the DRAM has a short channel effect. The short channel effect easily causes reduction of the threshold voltage of the DRAM, which affects the use performance of the DRAM.

That is, as the semiconductor structure tends to be integrated and miniaturized, the manufacturing process of the semiconductor structure is getting smaller and smaller, resulting in shorter and shorter gate channels. Too short gate channels will affect the performance of a metal oxide semiconductor transistor. This effect of affecting the performance of the semiconductor structure due to shortening of the gate channel is called the short channel effect. When the short channel effect occurs in the semiconductor structure, the short channel effect easily causes reduction of the threshold voltage of the semiconductor, which affects the storage performance of the semiconductor structure.

Figure 1:
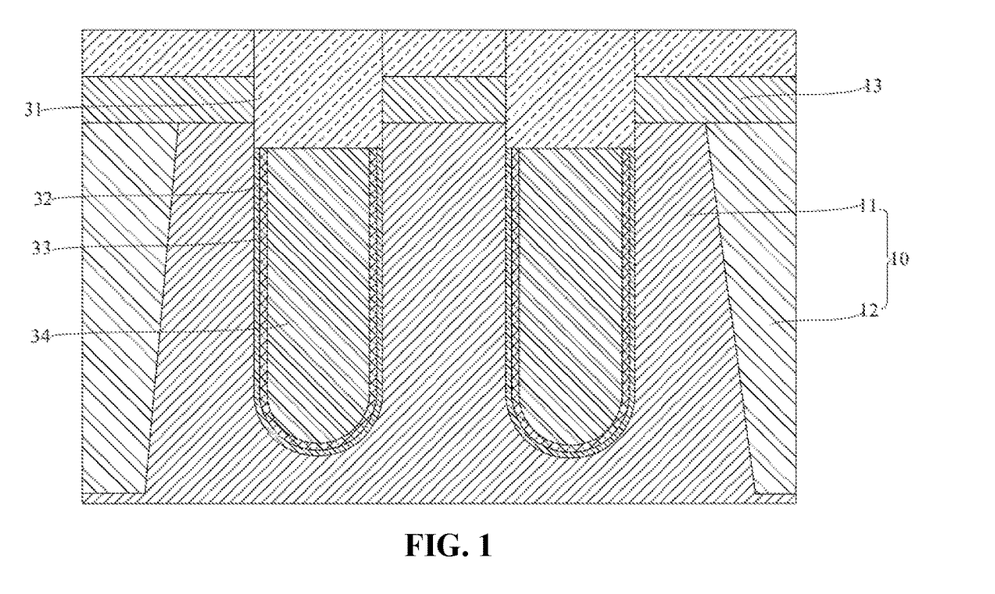
FIG. 1 is a schematic view of a semiconductor structure in some implementations.

For example, as shown in FIG. 1, in related technologies, the gate channel is usually U-shaped. When the length of the gate channel is reduced to the order of a dozen of nanometers or even a few nanometers, the proportion of the depletion regions of source and drain electrodes in the entire gate channel increases, the length of the gate channel is smaller, and then, the number of charges required for an inversion layer formed in the gate channel is reduced, thereby reducing the threshold voltage of the semiconductor structure and causing the short channel effect.

In view of the above technical problems, the embodiments of this disclosure provide a method for manufacturing a semiconductor structure and the semiconductor structure. A first groove located at an upper portion and a second groove located at a lower portion and communicating with the first groove are formed in an active region. The width of the first groove is greater than the width of the second groove, such that the shape of the groove is an inverted '凸' (convex) shape. That is, a side wall of the groove includes a first section, a second section and a third section which are sequentially connected, and the second section is perpendicular to the first section. Compared with a U-shaped groove in the related technologies, the length of the side wall of the groove can be increased without increasing the channel depth, thereby increasing the area of the inner walls of the groove, improving the problem of the threshold voltage reduction caused by the short channel effect, and enhancing the storage performance of the semiconductor structure.

In order to make the above objectives, features and advantages of the embodiments of this disclosure more obvious and understandable, the technical solutions in the embodiments of this disclosure will be clearly and completely described below with reference to the drawings in the embodiments of this disclosure. It is apparent that the described embodiments are only a part of the embodiments of this disclosure, but are not all of the embodiments. Based on the embodiments in this disclosure, all other embodiments obtained by those skilled in the art without creative efforts fall within the protection scope of this disclosure.

Figure 2:
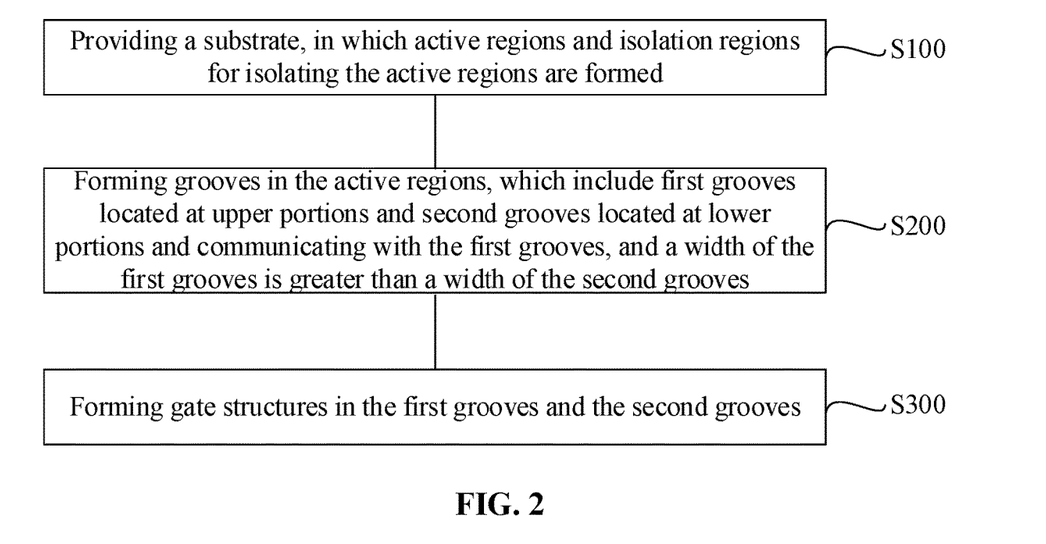
FIG. 2 is a flowchart of a method for manufacturing a semiconductor structure provided by an embodiment of this disclosure.

FIG. 2 is a flowchart of a method for manufacturing a semiconductor structure provided by an embodiment of this disclosure. FIG. 3 to FIG. 21 are schematic structural views of various stages of a method for manufacturing a semiconductor structure. The method for manufacturing the semiconductor structure will be introduced below with reference to FIG. 3 to FIG. 21.

The semiconductor structure is not limited in this embodiment. A DRAM is taken as an example for introduction of the semiconductor structure below which does not limit this embodiment. The semiconductor structure in this embodiment can also be other structures.

As shown in FIG. 2, the embodiments of this disclosure provide a method for manufacturing a semiconductor structure, including the following steps.

In S100, a substrate is provided, and active regions and isolation regions for isolating the active regions are formed in the substrate.

Figure 3:
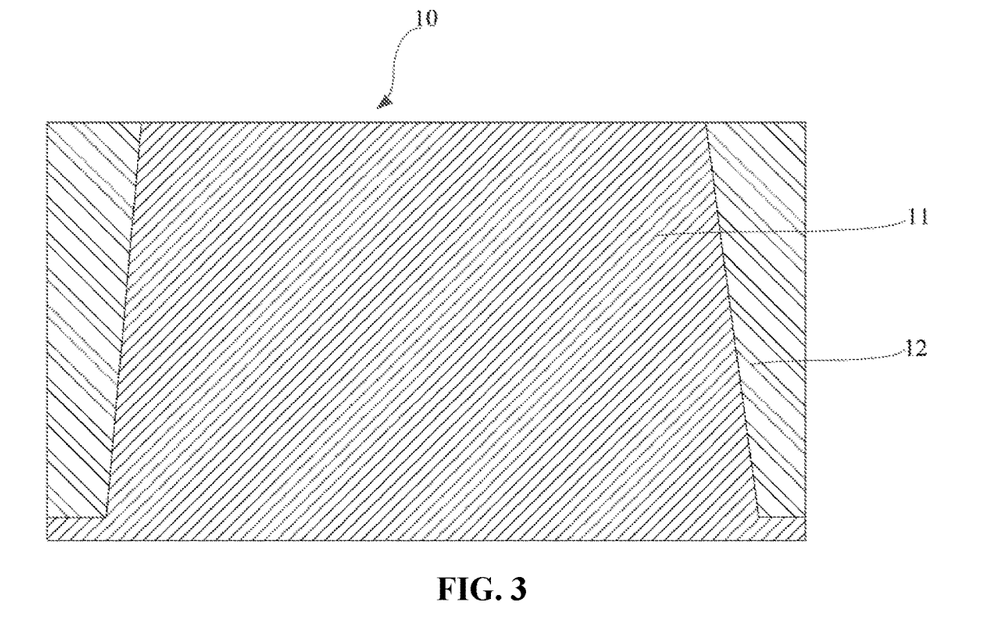
FIG. 3 is a schematic structural view I of a substrate in a method for manufacturing a semiconductor structure provided by an embodiment of this disclosure.

Exemplarily, referring to FIG. 3, a substrate 10 is used as a supporting component of the semiconductor structure to support other components arranged on the semiconductor structure. The substrate 10 can be made of a semiconductor material, and the semiconductor material can be one or more of silicon, germanium, silicon-germanium compounds and silicon-carbon compounds.

A plurality of active regions 11 and a plurality of isolation regions 12 are formed in the substrate 10. The isolation regions 12 are configured to isolate the active regions 11 to prevent adjacent active regions 11 from being electrically connected.

Figure 4:
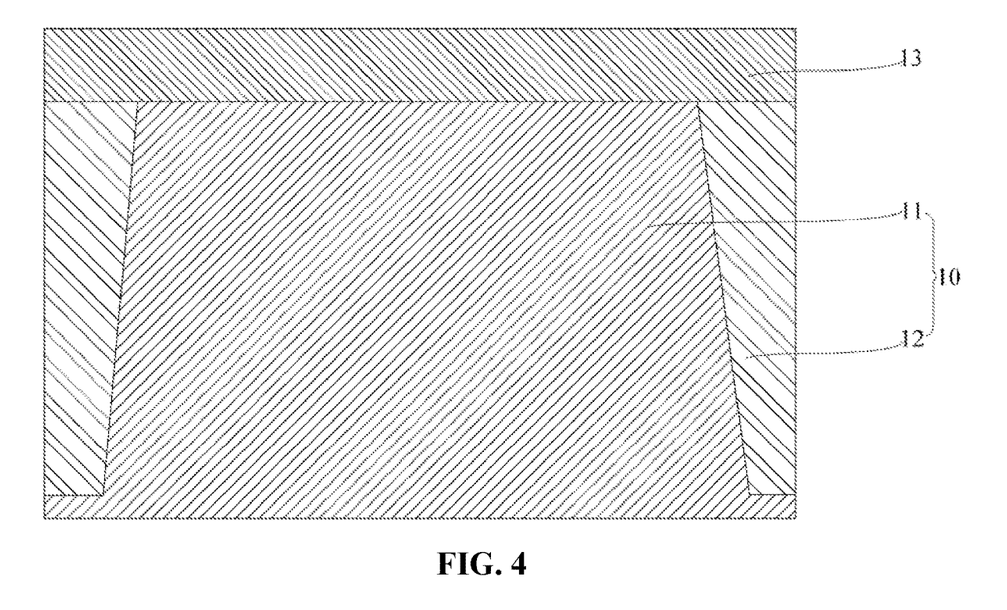
FIG. 4 is a schematic structural view II of a substrate in a method for manufacturing a semiconductor structure provided by an embodiment of this disclosure.

In addition, a substrate oxide layer 13 can be formed on the substrate 10. As shown in FIG. 4, the substrate oxide layer 13 with a certain thickness can be formed on the upper surface of the substrate 10 by an atomic layer deposition process or a chemical vapor deposition process. The substrate oxide layer 13 is used to isolate the substrate from a structural layer arranged on the substrate. The material of the substrate oxide layer 13 can be silicon oxide, and the thickness of the substrate oxide layer 13 is 2 nm to 20 nm.

This arrangement is due to the need to provide an isolation layer on a substrate under normal conditions. The material of the isolation layer is usually silicon nitride, the material of the substrate is generally silicon, and there will be stress in direct contact between silicon and silicon nitride. Therefore, the substrate oxide layer is arranged on the substrate, and the substrate oxide layer is used as a buffer layer to solve the problem of stress between silicon and silicon nitride.

In S200, grooves are formed in the active regions, each of the grooves includes a first groove located at a upper portion and a second groove located at a lower portion and communicating with the first groove, and a width of the first groove is greater than a width of the second groove.

Figure 5:
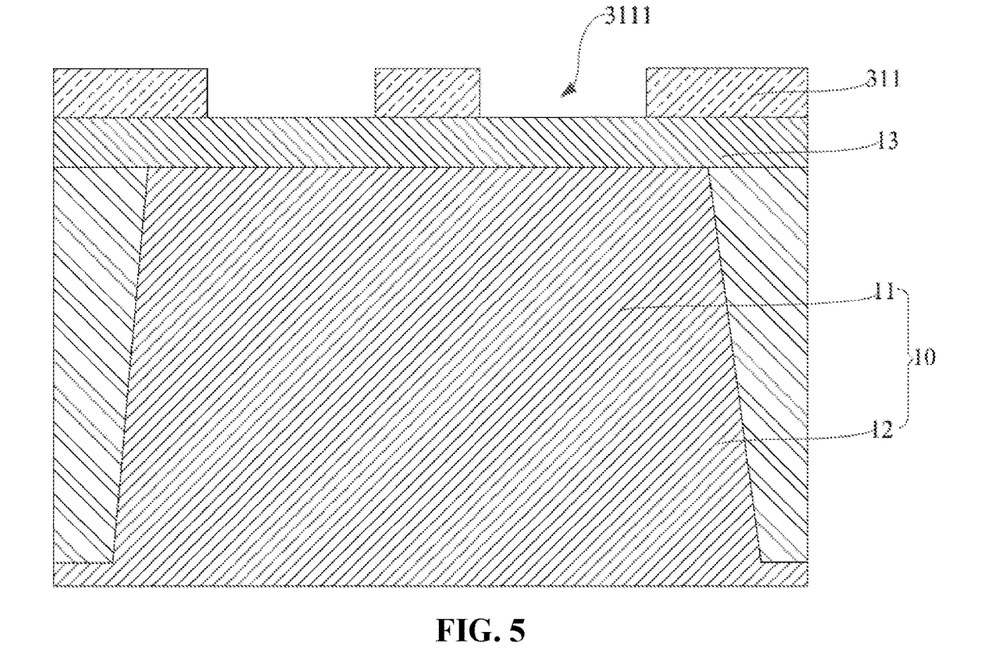
FIG. 5 is a schematic structural view after a first isolation layer is formed in a method for manufacturing a semiconductor structure provided by an embodiment of this disclosure.

Exemplarily, as shown in FIG. 5, a first isolation layer 311 is formed on the substrate oxide layer 13, and the first isolation layer 311 is patterned to form first openings 3111 in the first isolation layer 311. The projections of the first opening 3111 on the substrate 10 are located in the active regions 11.

In this step, a first isolation layer 311 with a certain thickness can be formed on the upper surface of the substrate oxide layer 13 by an atomic layer deposition process or a chemical vapor deposition process, and then, the first isolation layer 311 is patterned to form the first openings 3111 in the first isolation layer 311.

The material of the first isolation layer 311 can be any one of silicon nitride, silicon oxynitride, carbon, silicon oxide, spin-coated organic carbon and a carbon-containing polymer, and the thickness of the first isolation layer 311 can be 20 nm to 250 nm.

The process of forming the first openings 3111 can be performed as the followings. For example, a photoresist layer having patterns can be formed on the surface of the first isolation layer 311 distal to the substrate 10, and the first isolation layer 311 is patterned by taking the photoresist layer having patterns as a mask to form the first openings 3111 in the first isolation layer 311. The projections of the first openings 3111 on the substrate 10 are located in the active regions 11.

Figure 6:
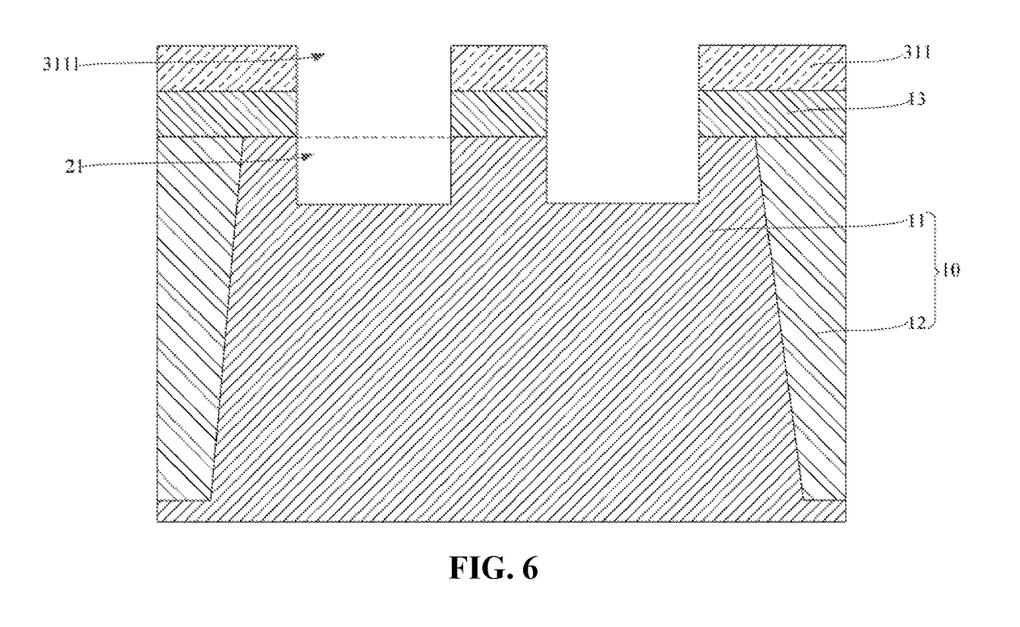
FIG. 6 is a schematic structural view after first grooves are formed in a method for manufacturing a semiconductor structure provided by an embodiment of this disclosure.

As shown in FIG. 6, the substrate 10 is patterned along the first openings 3111. That is, the substrate oxide layer 13 exposed in the projections of the first openings 3111 on the substrate 10 and a portion of the substrate 10 are removed by dry etching or wet etching to form first grooves 21 in the active regions 11.

It should be noted that in FIG. 6, the portion located above the dotted line is the first opening 3111, and the portion located under the dotted line is the first groove 21.

Figure 7:
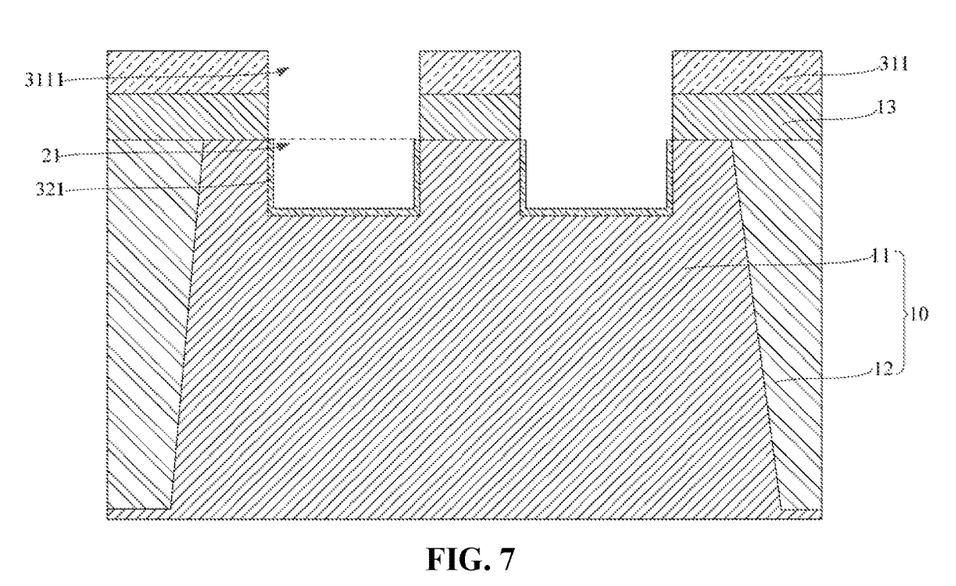
FIG. 7 is a schematic structural view after first oxide layers are formed in a method for manufacturing a semiconductor structure provided by an embodiment of this disclosure.

Since the first grooves 21 expose a portion of the active region 11 and the insides of the first grooves 21 are used to form gate structures 30, in order to prevent the conductive materials in the gate structures 30 from diffusing into the active regions 11, first oxide layers 321 are usually formed on the side walls and the bottom walls of the first grooves 21 through a thermal oxidation process to form a structure as shown in FIG. 7.

It should be noted that the gas used in the thermal oxidation process includes oxygen.

Figure 8:
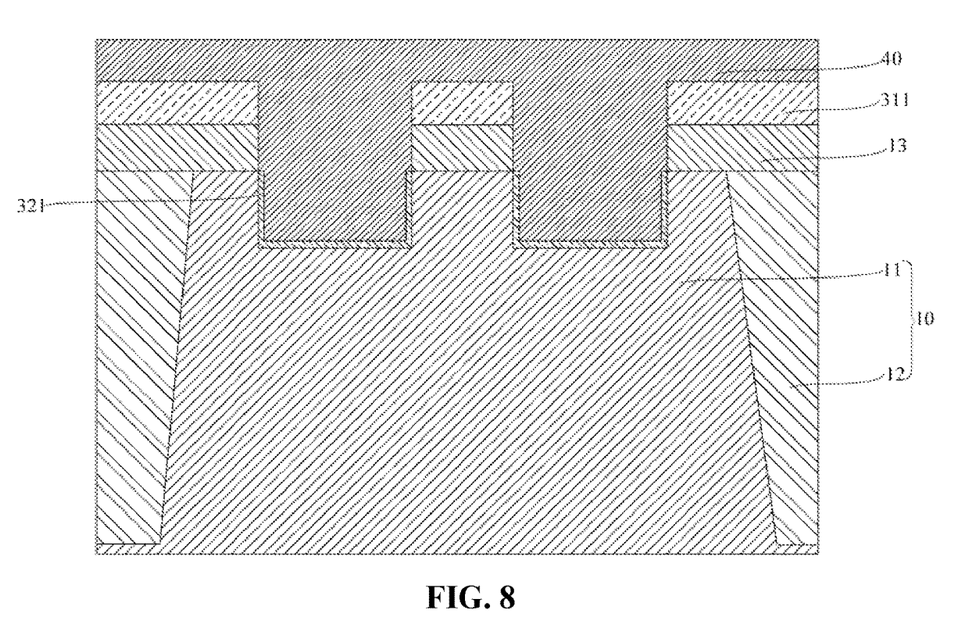
FIG. 8 is a schematic structural view I after a sacrificial layer is formed in a method for manufacturing a semiconductor structure provided by an embodiment of this disclosure.
Figure 9:
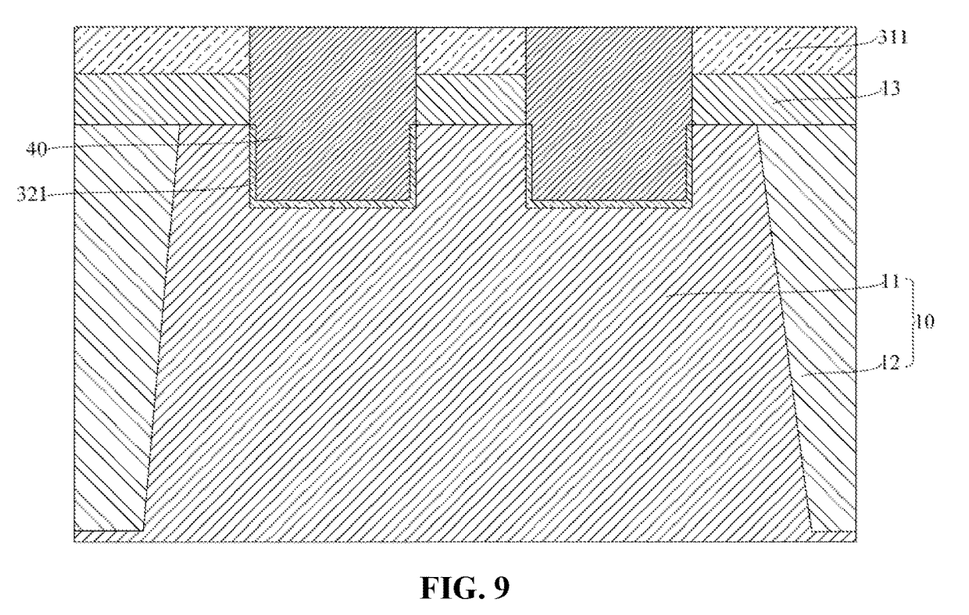
FIG. 9 is a schematic structural view II after a sacrificial layer is formed in a method for manufacturing a semiconductor structure provided by an embodiment of this disclosure.

After the first oxide layers 321 are formed in the first grooves 21, a sacrificial layer 40 can be formed in the first grooves 21 and the first openings 3111, the first grooves 21 and the first openings 3111 are filled with the sacrificial layer 40, and the structures are as shown in FIG. 8 and FIG. 9.

Specifically, as shown in FIG. 8 and FIG. 9, the first grooves 21 and the first openings 3111 can be filled with a dielectric layer by a chemical vapor deposition process, the dielectric layer covers the top surface of the first isolation layer 311, then the dielectric layer on the top surface of the first isolation layer 311 is etched off by an etching process, the dielectric layer in the first grooves 21 and the first openings 3111 is retained, the retained dielectric layer forms the sacrificial layer 40, and the top surface of the sacrificial layer 40 is flush with the top surface of the first isolation layer 311.

The material of the sacrificial layer 40 can include oxide, such as silicon oxide, and the material of the sacrificial layer 40 can also include carbon or other substances.

Figure 10:
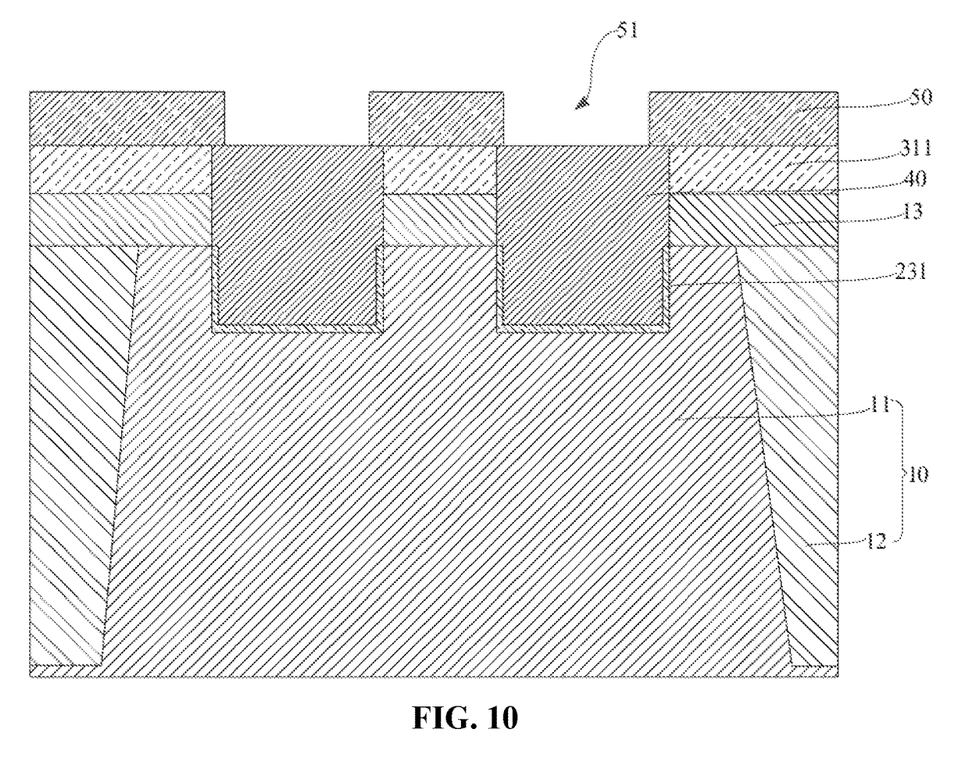
FIG. 10 is a schematic structural view after a photoresist layer is formed in a method for manufacturing a semiconductor structure provided by an embodiment of this disclosure.
Figure 11:
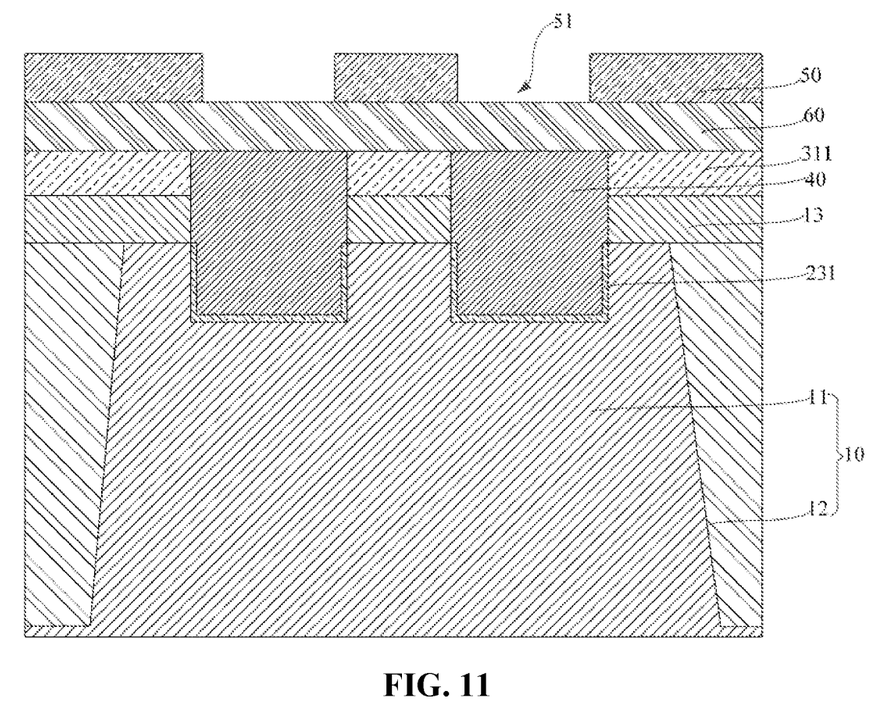
FIG. 11 is a schematic structural view after a mask layer is formed in a method for manufacturing a semiconductor structure provided by an embodiment of this disclosure.
Figure 12:
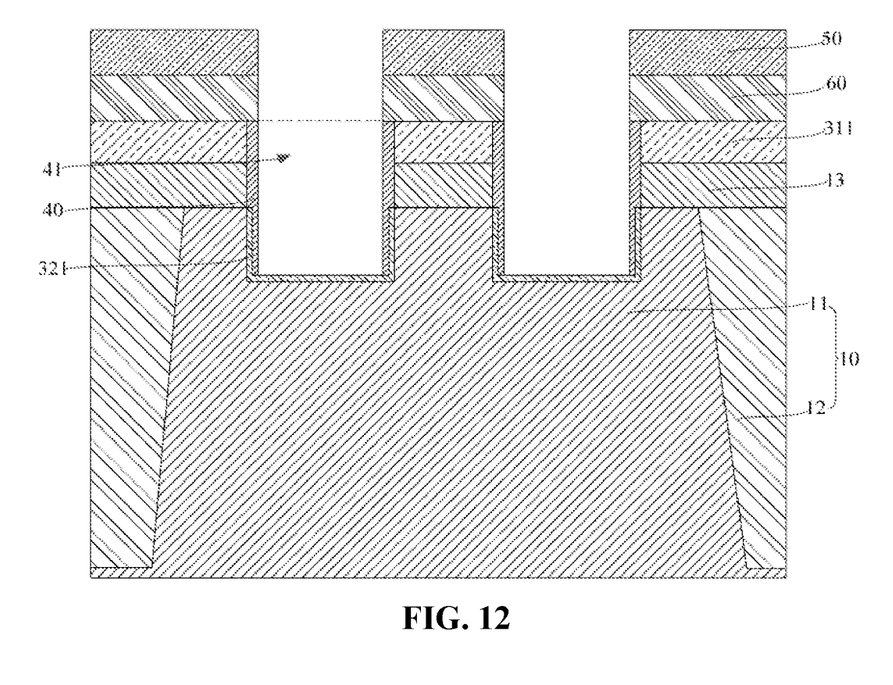
FIG. 12 is a schematic structural view after second openings are formed in a method for manufacturing a semiconductor structure provided by an embodiment of this disclosure.

Further, second openings 41 are formed in the sacrificial layer 40, and the width of the second opening 41 is smaller than the width of the first opening 3111, as shown in FIG. 10 to FIG. 12.

Specifically, as shown in FIG. 10, a photoresist layer 50 is formed on the first isolation layer 311 and the sacrificial layer 40, and the photoresist layer 50 is patterned to form third openings 51 in the photoresist layer 50.

In this embodiment, the manner of forming the third openings 51 can be directly defined by illumination, or can be directly defined by illumination first and then realized by means of spacing multiplication.

It should be noted that in this step, a mask layer 60 can also be formed on the surface of the first isolation layer 311 distal to the substrate, such that the photoresist layer 50 is located above the mask layer 60. The structure is shown in FIG. 11.

In this embodiment, the mask layer 60 is arranged between the photoresist layer 50 and the first isolation layer 311 to ensure the accuracy of the second openings to be etched. The material of the mask layer 60 can be any one of silicon oxynitride, silicon or silicon oxide.

As shown in FIG. 12, the mask layer 60 and the sacrificial layer 40 are patterned along the third openings 51, that is, the sacrificial layer 40 located in the projection regions of the third openings 51 on the substrate is removed to form second openings 41 in the sacrificial layer 40, and the width of the second opening 41 is smaller than the width of the first opening 3111.

It should be noted that in this embodiment, it can also be understood that the mask layer 60 and the sacrificial layer 40 in the projection regions of the third openings 51 on the substrate are removed to form second openings 41 in the sacrificial layer 40. The portion under the dotted line is the second opening 41.

Figure 13:
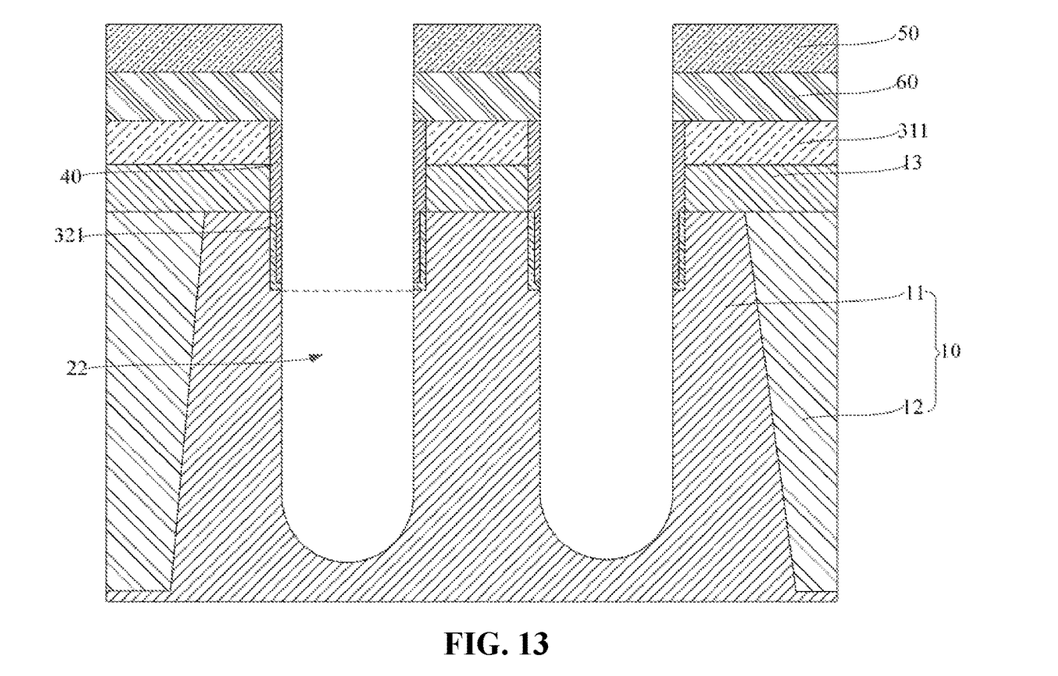
FIG. 13 is a schematic structural view after second grooves are formed in a method for manufacturing a semiconductor structure provided by an embodiment of this disclosure.

As shown in FIG. 13, a portion of the substrate 10 is patterned along the second openings 41, that is, the portion of the substrate located under the second openings 41 is removed by dry etching or wet etching to form second grooves 22 on the substrate, and the width of the formed second groove 22 is smaller than the width of the first groove 21.

It should be noted that the groove located under the dotted line in FIG. 13 is the second groove 22.

Figure 14:
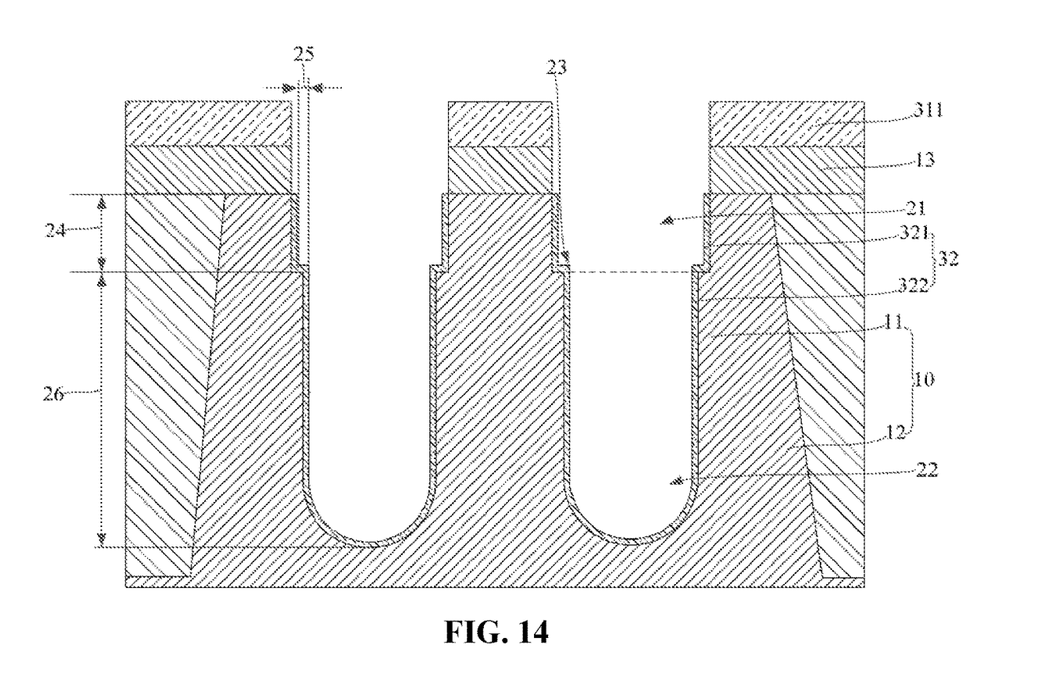
FIG. 14 is a schematic structural view after the sacrificial layer is removed in a method for manufacturing a semiconductor structure provided by an embodiment of this disclosure.

As shown in FIG. 14, the photoresist layer 50, the mask layer 60 and the sacrificial layer 40 in a first groove 21 are removed, such that step surfaces 23 are formed between the first groove 21 and the second groove 22. The first groove 21 is communicating with the second groove 22 to form a groove 20, the side wall of the groove 20 includes a first section 24, a second section 25 and a third section 26 which are sequentially connected, and the second section 25 is perpendicular to the first section 24.

In the embodiments of this disclosure, by designing the groove 20 having a first groove 21 and a second groove 22 with different widths, the step surfaces 23 are formed between the first groove 21 and the second groove 22. That is, in this embodiment, the side wall of the groove 20 includes the first section 24, the second section 25 and the third section 26 which are sequentially connected, and the second section 25 is perpendicular to the first section 24. Compared with a U-shaped groove, the length of the side wall of the groove is increased without increasing the channel depth, thereby increasing the area of the inner walls of the groove, improving the problem of the threshold voltage reduction caused by the short channel effect, and enhancing the storage performance of the semiconductor structure.

In some embodiments, after the step of removing the photoresist layer, the mask layer and the sacrificial layer such that the step surfaces are formed between the first grooves 21 and the second grooves 22, the method for manufacturing the semiconductor structure further includes the following operations.

As shown in FIG. 14, second oxide layers 322 are formed on the side walls and bottom walls of the second grooves 22. A second oxide layer 322 is connected with the first oxide layer 321, such that the oxide layer 32 formed by the first oxide layer 321 and the second oxide layer 322 covers the surfaces of the first groove 21 and the second groove 22 to isolate the gate structure 30 from the substrate to ensure the performance of the gate structure 30. The material of the second oxide layer 322 can include silicon oxide.

The second oxide layer 322 can also be manufactured by a thermal oxidation process or other processes, which is not specifically limited in this embodiment.

Figure 15:
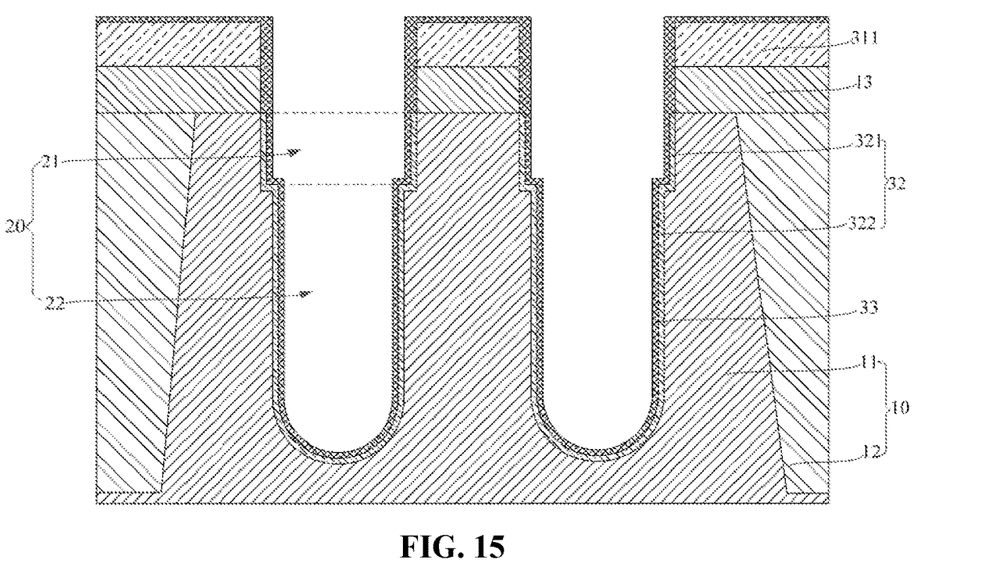
FIG. 15 is a schematic structural view after second oxide layers and a barrier layer are formed in a method for manufacturing a semiconductor structure provided by an embodiment of this disclosure.

As shown in FIG. 15, a barrier layer 33 is formed on the first oxide layers 321 and the second oxide layers 322, and the barrier layer 33 extends to the outsides of the first grooves 21 and covers the surface of the first isolation layer 311.

In this embodiment, by the arrangement of the barrier layer 33, the conductive material in the gate structure 30 can be prevented from permeating into the substrate, thereby further ensuring the performance of the gate structure 30. The material of the barrier layer 33 can include titanium nitride, or other substances that block the diffusion of the conductive material in the gate structure 30.

Further, a conductive layer 34 and a second isolation layer 312 are formed in the first grooves 21 and the second grooves 22 to complete the manufacturing process of the gate structure 30, as shown in FIG. 16 to FIG. 21.

Figure 16:
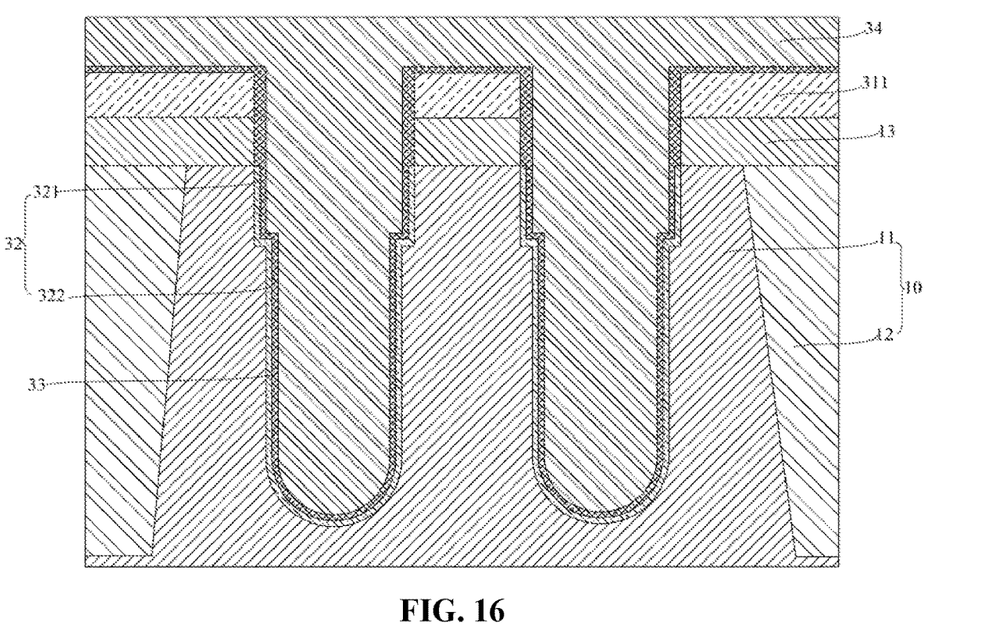
FIG. 16 is a schematic structural view I after a conductive layer is formed in a method for manufacturing a semiconductor structure provided by an embodiment of this disclosure.

Specifically, as shown in FIG. 16, the conductive layer 34 can be formed in the first grooves 21 and the second grooves 22 by a chemical vapor deposition process, and the conductive layer 34 fills the first grooves 21 and the second grooves 22, and extends to the outsides of the first grooves 21 and covers the surface of the barrier layer 33. The material of the conductive layer 34 can be tungsten.

Figure 17:
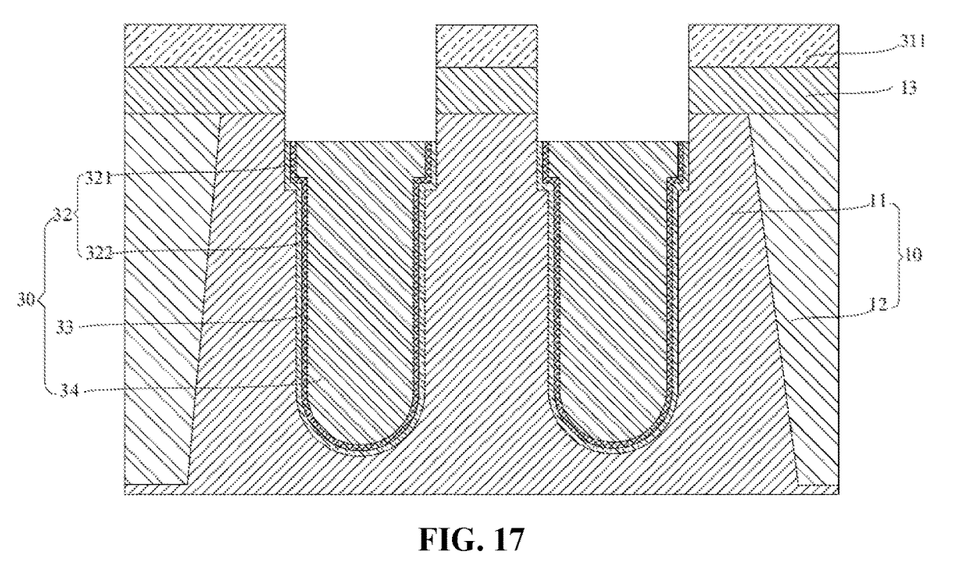
FIG. 17 is a schematic structural view II after the conductive layer is formed in a method for manufacturing a semiconductor structure provided by an embodiment of this disclosure.

As shown in FIG. 17, the conductive layer 34 and the barrier layer 33 outside the first grooves 21 are removed by an etching process.

A portion of the conductive layer 34 and a portion of the barrier layer 33 in the first grooves 21 are removed by an etching process, and a portion of the conductive layer 34 and a portion of the barrier layer 33 in the first grooves 21 and the conductive layer 34 and the barrier layer 33 in the second grooves 22 are retained to form the conductive layer 34 and the barrier layer 33 in the gate structure 30.

Figure 18:
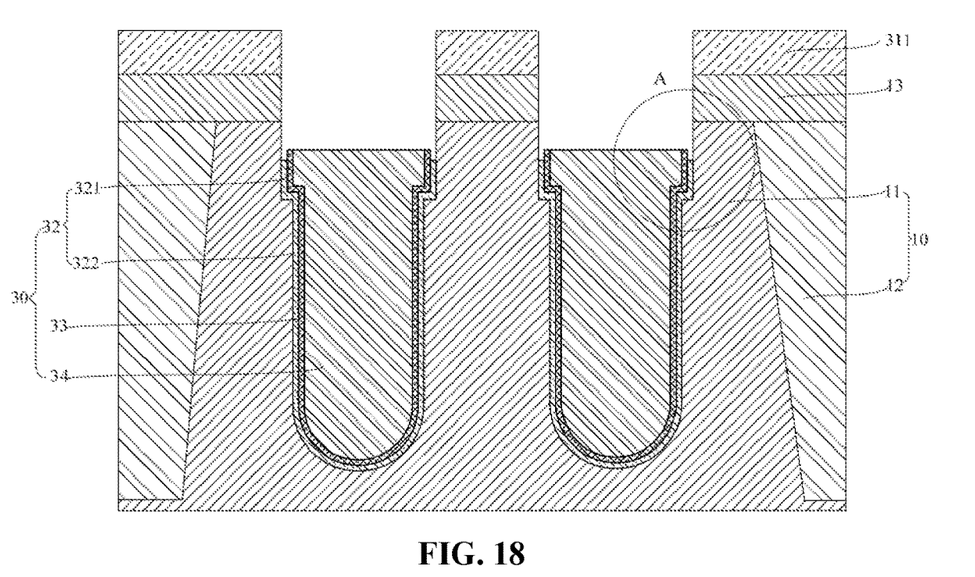
FIG. 18 is a schematic structural view after a portion of the barrier layer is removed in a method for manufacturing a semiconductor structure provided by an embodiment of this disclosure.
Figure 19:
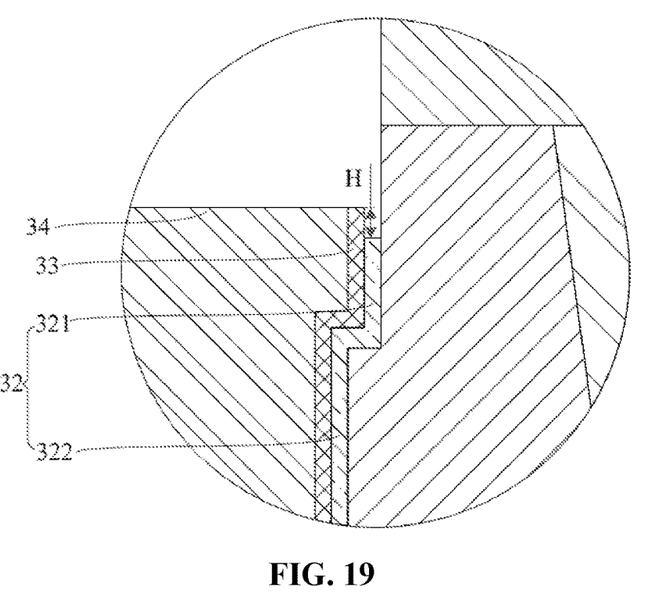
FIG. 19 is an enlarged schematic view of region A in FIG. 18.

Further, as shown in FIG. 18 and FIG. 19, after the step of removing a portion of the conductive layer 34 and a portion of the barrier layer 33 in the first grooves 21, it is also necessary to remove a portion of the barrier layer 33 by an etching process, such that the top surface of the barrier layer 33 is lower than the top surface of the conductive layer 34. In other words, there is a height difference H between the top surface of the barrier layer 33 and the top surface of the conductive layer 34, and the height difference H is 0 nm to 25 nm.

In the embodiments of this disclosure, by forming the height difference H between the barrier layer 33 and the conductive layer 34, the problem of current leakage of the gate structure 30 can be prevented, the performance of the gate structure 30 is ensured, and at the same time, the performance of the semiconductor structure is also ensured.

In some embodiments, after the step of removing a portion of the conductive layer 34 and a portion of the barrier layer 33 in the first grooves 21 to form the gate structures 30, the method for manufacturing the semiconductor structure further includes the following operation.

Figure 20:
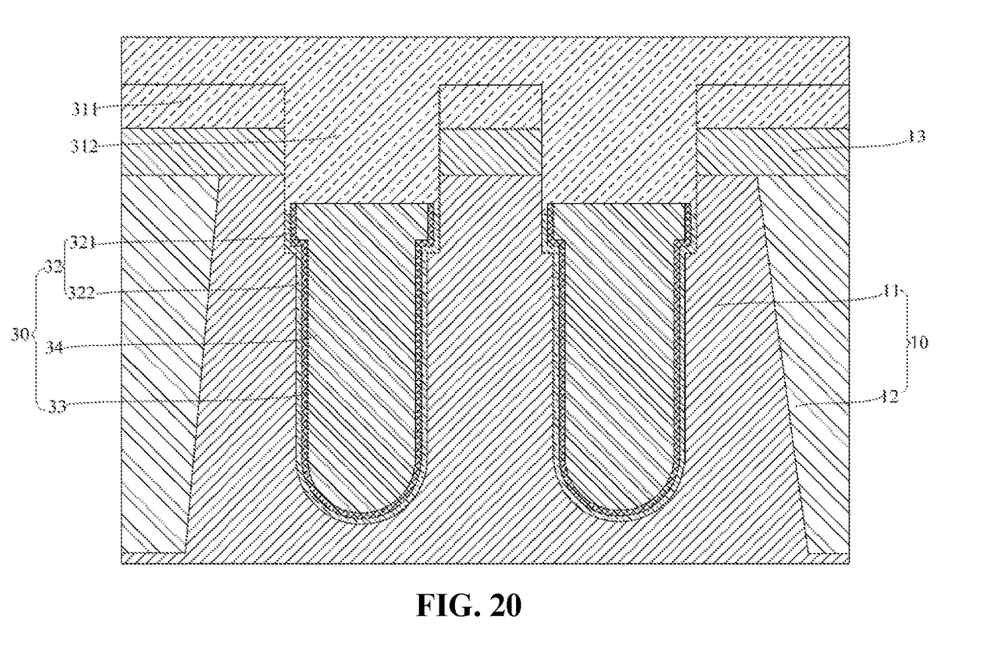
FIG. 20 is a schematic structural view I after a second isolation layer is formed in a method for manufacturing a semiconductor structure provided by an embodiment of this disclosure.
Figure 21:
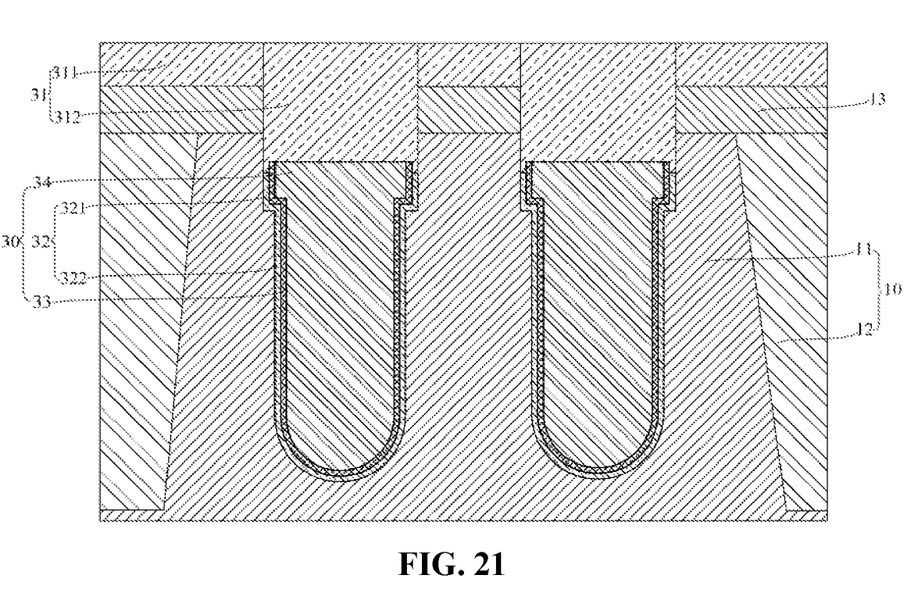
FIG. 21 is a schematic structural view II after the second isolation layer is formed in a method for manufacturing a semiconductor structure provided by an embodiment of this disclosure.

A second isolation layer 312 is formed in the first grooves 21, and the top surface of the second isolation layer 312 is flush with the top surface of the first isolation layer 311, as shown in FIG. 20 and FIG. 21.

Specifically, as shown in FIG. 20 and FIG. 21, the second isolation layer 312 is deposited in the first grooves 21 and the first openings 3111. The second isolation layer 312 extends to the outsides of the first grooves 21 and covers the surface of the first isolation layer 311. Then the second isolation layer 312 on the surface of the first isolation layer 311 is removed by an etching process, and the second isolation layer 312 in the first grooves 21 and the first openings 3111 is retained. The material of the second isolation layer 312 can be the same as the material of the first isolation layer 311, and the first isolation layer 311 and the second isolation layer 312 form an isolation layer 31 in the gate structure 30, thereby realizing the isolation between the substrate and the gate structure in the semiconductor structure.

As shown in FIG. 21, the embodiments of this disclosure further provide a semiconductor structure, including a substrate 10, grooves 20 formed in the substrate 10, and gate structures 30. A plurality of active regions 11 and isolation regions 12 for isolating the active regions 11 are arranged in the substrate 10.

The grooves 20 are arranged in the active regions 11. A groove 20 includes a first groove 21 located at the upper portion and a second groove 22 located at the lower portion and communicating with the first groove 21, and a width of the first groove 21 is greater than a width of the second groove 22, such that step surfaces 23 are formed between the first groove 21 and the second groove 22.

In this embodiment, the depth of the first groove 21 is 20 nm to 100 nm, the width of the first groove 21 is 10 nm to 90 nm, the depth of the second groove 22 is 50 nm to 300 nm, and the width of the second groove 22 is 5 nm to 60 nm, such that step surfaces 23 are formed between the first groove 21 and the second groove 22. Compared with equal-diameter grooves, the perimeter of the groove in this embodiment is increased, thereby increasing the area of the inner walls of the groove, improving the problem of the threshold voltage reduction caused by the short channel effect, and enhancing the storage performance of the semiconductor structure.

The gate structure 30 is arranged in the first groove 21 and the second groove 22, and the top surface of the gate structure 30 is lower than the top surface of the first groove 21, thereby facilitating the formation of the second isolation layer 312 on the gate structure 30 to realize insulation between the gate structure 30 and other components in the semiconductor structure.

In some embodiments, a gate structure 30 includes an oxide layer 32, a barrier layer 33 and a conductive layer 34, and the oxide layer 32 covers the side walls and bottom wall of the second groove 22, the step surfaces 23 and the side walls of the first groove 21.

The barrier layer 33 covers the surface of the oxide layer 32, and the top surface of the barrier layer 33 is lower than the top surface of the oxide layer 32.

The conductive layer 34 covers the surface of the barrier layer 33 and fills the second groove 22 and a portion of the first groove 21, and the top surface of the conductive layer 34 is higher than the top surface of the barrier layer 33 and lower than the top surface of the oxide layer 32.

In this embodiment, by the arrangement of the oxide layer 32 and the barrier layer 33, the substrate and the conductive layer 34 can be isolated to prevent the conductive material in the conductive layer 34 from diffusing into the substrate to ensure the conductivity of the conductive layer 34, thereby ensuring the performance of the semiconductor structure.

Further, the gate structure 30 further includes an isolation layer 31, the isolation layer 31 is arranged in the first groove 21, and the isolation layer 31 fills the first groove 21, and extends to the outside of the first groove 21 and covers the top surface of the substrate oxide layer 13.

Exemplarily, an isolation layer 31 includes a first isolation layer 311 and a second isolation layer 312 which are connected to each other, the first isolation layer 311 is arranged on the top surface of the substrate oxide layer 13 distal to the substrate, and the first groove 21 and the first opening 3111 are filled with the second isolation layer 312.

In the embodiments of this disclosure, by designing the groove 20 for forming the gate structure into a first groove 21 and a second groove 22 with different widths, step surfaces 23 can be formed between the first groove 21 and the second groove 22. That is, the side wall of the groove 20 includes the first section 24, the second section 25 and the third section 26 which are sequentially connected, and the second section 25 is perpendicular to the first section 24. Compared with a U-shaped groove in related technologies, the length of the side wall of the groove can be increased without increasing the channel depth, thereby increasing the area of the inner walls of the groove, improving the problem of the threshold voltage reduction caused by the short channel effect, and enhancing the storage performance of the semiconductor structure.

In this specification, each of the embodiments or implementation manners is described in a progressive manner, each of the embodiments focuses on the differences from other embodiments, and the same or similar parts between the embodiments can be referred to each other.

In the description of this specification, the description with reference to the terms "one implementation manner", "some implementation manners", "exemplary implementation manners", "examples", "specific examples", or "some examples", etc. means that the specific features, structures, materials or characteristics described with reference to the implementation manners or examples are involved in at least one implementation manner or example of this disclosure.

In this specification, exemplary descriptions of the foregoing terms do not necessarily refer to the same embodiment or example. In addition, the described specific features, structures, materials, or characteristics may be combined in a proper manner in any one or more of the embodiments or examples.

Finally, it is to be noted that the foregoing embodiments are merely intended for describing the technical solutions of this disclosure, but not for limiting this disclosure. Although this disclosure is described in detail with reference to the foregoing embodiments, persons of ordinary skill in the art should understand that they may still make modifications to the technical solutions described in the foregoing embodiments or make equivalent replacements to some or all technical features thereof, without making the essence of the corresponding technical solutions departing from the scope of the technical solutions of the embodiments of this disclosure.

What is claimed is:

1. A method for manufacturing a semiconductor structure, comprising:
    providing a substrate, wherein active regions and isolation regions for isolating the active regions are formed in the substrate;
    forming grooves in the active regions, wherein the grooves comprise first grooves located at upper portions and second grooves located at lower portions and communicating with the first grooves, and a width of the first grooves is greater than a width of the second grooves;
    forming gate structures in the first grooves and the second grooves; and
    wherein said forming the grooves in the active regions comprises:
    forming a first isolation layer on the substrate, and patterning the first isolation layer to form first openings in the first isolation layer corresponding to the active regions;
    patterning the substrate along the first openings to form the first grooves in the active regions;
    forming sacrificial layers in the first grooves and the first openings, wherein the first grooves and the first openings are filled up with the sacrificial layers;
    forming second openings in the sacrificial layers, wherein a width of the second opening is smaller than a width of the first openings; and
    patterning the substrate along the second openings to form the second grooves in the active regions.

2. The method for manufacturing the semiconductor structure of claim 1, further comprising: after said patterning the substrate along the first openings to form the first grooves in the active regions, and prior to said forming the sacrificial layers in the first grooves and the first openings,
    forming first oxide layers on the side walls and bottom walls of the first grooves.

3. The method for manufacturing the semiconductor structure of claim 2, wherein said forming the second openings in the sacrificial layers comprises:
    forming a photoresist layer on the first isolation layer, and patterning the photoresist layer to form third openings on the photoresist layer; and
    patterning the sacrificial layers along the third openings to form second openings in the sacrificial layers.

4. The method for manufacturing the semiconductor structure of claim 3, wherein said forming the photoresist layer on the first isolation layer comprises:
    forming a mask layer on the first isolation layer, wherein the photoresist layer is located on the mask layer.

5. The method for manufacturing the semiconductor structure of claim 4, further comprising: after said patterning the substrate along the second openings to form the second grooves in the active regions,
    removing the photoresist layer, the mask layer and the sacrificial layers such that step surfaces are formed between the first grooves and the second grooves.

6. The method for manufacturing the semiconductor structure of claim 5, further comprising: after said removing the photoresist layer, the mask layer and the sacrificial layers such that step surfaces are formed between the first grooves and the second grooves,
    forming second oxide layers on the side walls and bottom walls of the second grooves, wherein the second oxide layers are connected with the first oxide layers; and
    forming a barrier layer on the first oxide layers and the second oxide layers, wherein the barrier layer extends to an outside of the first grooves and covers a surface of the first isolation layer.

7. The method for manufacturing the semiconductor structure of claim 6, wherein said forming the gate structures in the first grooves and the second grooves comprises:
    forming a conductive layer in the first grooves and the second grooves, wherein the first grooves and the second grooves are filled up with the conductive layer, and the conductive layer extends to the outside of the first grooves and covers a surface of the barrier layer;
    removing the conductive layer and the barrier layer outside the first grooves; and removing a portion of the conductive layer and a portion of the barrier layer in the first grooves to form the gate structures.

8. The method for manufacturing the semiconductor structure of claim 7, wherein a top surface of the barrier layer is lower than a top surface of the conductive layer; and the top surface of the conductive layer is lower than a top surface of a first oxide layer.

9. The method for manufacturing the semiconductor structure of claim 8, further comprising: after said removing a portion of the conductive layer and a portion of the barrier layer in the first grooves to form the gate structures,
forming a second isolation layer in the first grooves, wherein a top surface of the second isolation layer is flush with a top surface of the first isolation layer.

10. The method for manufacturing the semiconductor structure of claim 1, wherein said forming the first isolation layer on the substrate comprises:
forming a substrate oxide layer on the substrate, wherein the substrate oxide layer is located below the first isolation layer.

11. A semiconductor structure, comprising:
a substrate, wherein active regions and isolation regions for isolating the active regions are arranged in the substrate;
grooves arranged in the active regions, wherein the grooves comprise first grooves located at upper portions and second grooves located at lower portions and communicating with the first grooves, and a width of the first grooves is greater than a width of the second grooves, such that step surfaces are formed between the first grooves and the second grooves; and
gate structures arranged in the first grooves and the second grooves; wherein top surfaces of the gate structures are lower than top surfaces of the first grooves.

12. The semiconductor structure of claim 11, wherein a depth of the first grooves is 20 nm to 100 nm, the width of the first grooves is 10 nm to 90 nm, a depth of the second grooves is 50 nm to 300 nm, and the width of the second grooves is 5 nm to 60 nm.

13. The semiconductor structure of claim 12, wherein a gate structure comprises:
an oxide layer, wherein the oxide layer covers the side walls and bottom wall of the second groove, as well as the step surfaces and the side walls of the first groove;
a barrier layer, wherein the barrier layer covers the surface of the oxide layer, and a top surface of the barrier layer is lower than a top surface of the oxide layer; and
a conductive layer, wherein the conductive layer covers a surface of the barrier layer and fills the second groove and a portion of the first groove, and a top surface of the conductive layer is higher than a top surface of the barrier layer and lower than a top surface of the oxide layer.

14. The semiconductor structure of claim 13, wherein a height difference between the top surface of the barrier layer and the top surface of the conductive layer is 0 nm to 25 nm.

15. The semiconductor structure of claim 14, wherein a material of the barrier layer comprises titanium nitride.

16. The semiconductor structure of claim 11, further comprising a substrate oxide layer, and the substrate oxide layer is arranged on the substrate.

17. The semiconductor structure of claim 16, further comprising an isolation layer, wherein the isolation layer is arranged in the first grooves, fills up the first grooves, and extends to an outside of the first grooves.

18. The semiconductor structure of claim 17, wherein the isolation layer comprises first isolation layer and second isolation layer connected with the first isolation layer, the first isolation layer is arranged on a top surface of the substrate oxide layer distal to the substrate, and the second isolation layer is arranged in the first grooves.

19. The semiconductor structure of claim 18, wherein a material of the first isolation layer comprises any one of silicon nitride, silicon oxynitride, carbon, silicon oxide, spin-coated organic carbon, and a carbon-containing polymer.

* * * * *